United States Patent
Sobiech et al.

(10) Patent No.: US 9,869,015 B2
(45) Date of Patent: Jan. 16, 2018

(54) HARD MATERIAL LAYERS WITH SELECTED THERMAL CONDUCTIVITY

(71) Applicants: Oerlikon Surface Solutions AG, Trübbach, Trübbach (CH); ETH Zürich, Zürich (CH); Empa, Dübendorf (CH)

(72) Inventors: Matthias Lukas Sobiech, Wasserburg (DE); Sebastian Stein, Achern (DE); Paul Heinrich Böttger, Zürich (CH); Valery Shklover, Zürich (CH); Jörg Patscheider, Meilen (CH)

(73) Assignees: Oerlikon Surface Solutions AG, Pfäffikon, Pfäffikon (CH); ETH ZÜRICH, Zürich (CH); EMPA, Dübendorf (CH)

( * ) Notice: Subject to any disclaimer, the term of this patent is extended or adjusted under 35 U.S.C. 154(b) by 100 days.

(21) Appl. No.: 14/781,135

(22) PCT Filed: Mar. 26, 2014

(86) PCT No.: PCT/EP2014/000811
§ 371 (c)(1),
(2) Date: Sep. 29, 2015

(87) PCT Pub. No.: WO2014/154356
PCT Pub. Date: Oct. 2, 2014

(65) Prior Publication Data
US 2016/0138153 A1 May 19, 2016

(30) Foreign Application Priority Data

Mar. 29, 2013 (DE) .................. 10 2013 005 437

(51) Int. Cl.
*C23C 14/34* (2006.01)
*C23C 14/00* (2006.01)
(Continued)

(52) U.S. Cl.
CPC ........ *C23C 14/3492* (2013.01); *B23B 27/148* (2013.01); *C23C 14/0042* (2013.01);
(Continued)

(58) Field of Classification Search
USPC .......... 51/307, 309; 428/698, 699, 701, 702, 428/697; 204/192, 192.15, 192.16
See application file for complete search history.

(56) References Cited

U.S. PATENT DOCUMENTS 6,254,984 B1 * 7/2001 Iyori ..................... C23C 28/044
428/699
6,586,122 B2 * 7/2003 Ishikawa ............... C23C 30/005
51/309

(Continued)

FOREIGN PATENT DOCUMENTS

DE    102010052687 A1    5/2012
EP       0947607 A2    10/1999
(Continued)

OTHER PUBLICATIONS

Makino et al "Characterization of Ti(NxOy) coatings produced by arc ion plating" Surface & Coatings Tech 98 (1998) p. 934-938.*
(Continued)

*Primary Examiner* — Archene Turner

(57) ABSTRACT

A hard material layer system with a multilayer structure, comprising alternating layers A and B, with A layers having the composition $Me_{ApA}O_{nA}N_{mA}$ in atomic percent and B layers having the composition $Me_{BpB}O_{nB}N_{mB}$ in atomic percent, where the thermal conductivity of the A layers is greater than the thermal conductivity of the B layers. $Me_A$ and $Me_B$ each comprise at least one metal of the group Ti, Zr, Hf, V, Nb, Ta, Cr, Mo, W, and Al, $p_A$ indicates the atomic percentage of $Me_A$ and $p_B$ indicates the atomic percentage of $Me_B$ and the following is true: $P_A=P_B$, $n_A$ indicates the oxygen concentration in the A layers in atomic percent and
(Continued)

*According to the functional relationship between oxygen concentration and thermal conductivity $n_B$ indicates the oxygen concentration in the B layers in atomic percent and the following is true: $n_A < n_B$, and $m_A$ indicates the nitrogen concentration in the A layers in atomic percent and $m_B$ indicates the nitrogen concentration in the B layers in atomic percent and the following is true: $p_A/(n_A + m_A) = p_B/(n_B + m_B)$.

15 Claims, 2 Drawing Sheets

(51) Int. Cl.
  *C23C 14/06* (2006.01)
  *C23C 28/00* (2006.01)
  *C23C 28/04* (2006.01)
  *B23B 27/14* (2006.01)
(52) U.S. Cl.
  CPC ...... *C23C 14/0084* (2013.01); *C23C 14/0641* (2013.01); *C23C 14/0676* (2013.01); *C23C 28/042* (2013.01); *C23C 28/044* (2013.01); *C23C 28/42* (2013.01); *C23C 28/44* (2013.01); *B23B 2222/64* (2013.01); *B23B 2222/88* (2013.01); *B23B 2228/08* (2013.01); *B23B 2228/10* (2013.01)

(56) References Cited

U.S. PATENT DOCUMENTS

| | | | | |
|---|---|---|---|---|
| 7,060,345 | B2* | 6/2006 | Fukui | C23C 14/0635 428/699 |
| 7,166,155 | B2* | 1/2007 | Ishikawa | C23C 14/06 428/697 |
| 7,348,074 | B2* | 3/2008 | Derflinger | C23C 14/0641 51/307 |
| 7,960,016 | B2* | 6/2011 | Lechthaler | C23C 14/0641 204/192.1 |
| 2006/0269789 | A1* | 11/2006 | Toihara | C04B 35/58007 428/698 |
| 2008/0318062 | A1* | 12/2008 | Endrino | C23C 14/0635 428/446 |
| 2010/0215975 | A1* | 8/2010 | Yamamoto | C23C 14/0021 428/697 |
| 2011/0111193 | A1* | 5/2011 | Lechthaler | C23C 14/0036 204/192.38 |
| 2013/0153408 | A1 | 6/2013 | Ramm et al. | |

FOREIGN PATENT DOCUMENTS

| | | | |
|---|---|---|---|
| EP | 2107134 | A1 | 10/2009 |
| JP | 2001-121314 | * | 5/2001 |
| JP | 2001198709 | A | 7/2001 |
| JP | 2004106103 | A | 4/2004 |
| JP | 2004-256922 | * | 9/2004 |
| JP | 2009167498 | A | 7/2009 |
| JP | 2012192513 | A | 10/2012 |
| WO | 2011036246 | A2 | 3/2011 |

OTHER PUBLICATIONS

Frank Barthelmä, et al. "Oxygen-Improved Hard Coatings for High Performance Cutting Processes," Procedia CIRP, Jan. 2012, pp. 208-213, vol. 1, Elsevier.

L. Castaldi, et al. "Effect of the Oxygen Content on the Structure, Morphology and Oxidation Resistance of Cr—O—N Coatings," Surface & Coatings Technology, May 2008, pp. 545-549, vol. 203, Elsevier.

* cited by examiner

*According to the functional relationship between oxygen concentration and thermal conductivity

*According to the functional relationship between oxygen concentration and thermal conductivity

HARD MATERIAL LAYERS WITH SELECTED THERMAL CONDUCTIVITY

FIELD OF THE INVENTION

The present invention relates to a hard material layer system having at least one oxynitride hard material layer with a predetermined thermal conductivity. The present invention also relates to a method for manufacturing oxynitride hard material layers with a selected thermal conductivity, which can be suitable in particular for the chip-removing machining of hard-to-machine materials such as nickel- and/or titanium-based alloys.

BACKGROUND OF THE INVENTION

Compared to Al-based materials or low-alloyed and unalloyed steels, Ti-based alloys have a significantly lower thermal conductivity. In addition, the tensile strength of Ti-based materials is significantly higher. Due to the low thermal conductivity of λ=4 to 1 W/mK, heat dissipation plays an important role during the chip generation process in the machining. For example, when machining Ti-based materials, about 30% more energy goes into the tool in comparison to when machining CK45 with otherwise equal process parameters. This results in an increased thermal load on the cutting tool and thus promotes tool wear. Conversely, the technological parameters for machining Ti-based materials are reduced so that the productivity and thus the efficiency are significantly lower when machining Ti-based materials than when machining other materials.

Ni-based materials such as Inconel have a high thermal stability and are therefore frequently encountered, particularly in turbine construction. In addition, the material has sufficient strength even at extremely high temperatures.

Due to the generally high requirements of the chip-removing machining process when machining Ti- and Ni-based materials, the technological parameters are comparatively low and thus the productivity and efficiency are also low.

In addition, the resulting high thermal load in the chip-removing machining process results in comb-like edge crack formation and/or crater wear, which further promotes the abrasive wear mechanism on the active surfaces of machining tools. Adhesive wear and plastic deformation of the cut material are also observed, depending on the material.

In addition, current testing shows that purely AlCrN-based layer systems and purely AlTiN-based layer systems are subject to wear mechanisms that are similar to those of the surfaces of uncoated substrates and as a result, neither of the two layer systems achieves a significant advantage.

According to the prior art, some oxynitride-based hard material layers are nevertheless considered to be well suited for chip-removing machining of hard-to-machine materials.

The patent JP2012192513A, for example, discloses a coated cutting tool for chip-removing machining whose coating enables a higher performance in the wet chip-removing machining of hard-to-machine materials such as titanium-based alloys. The coating is composed of an inner layer and an outer layer; the inner layer is an oxynitride layer composed of titanium and aluminum with a layer thickness of between 0.5 and 3.4 μm and the outer layer is a nitride layer composed of titanium and aluminum with a layer thickness of between 0.8 and 4.0 μm. The oxynitride layer has micropores that are distributed across the layer thickness and have a diameter of between 0.1 and 1.5 μm. In addition, the composition of such an oxide layer corresponds to the following equation in atomic percent: $(Ti_{1-x}Al_x)N_{1-y}O_y$, where x is between 0.4 and 0.75 and y is between 0.1 and 0.4.

The patent JP2009167498A also relates to oxynitride edge layers. In this case, the oxynitride edge layers are produced by means of the anodic oxidation of the substrate, with layer thicknesses of 5 to 30 μm. This also reduces the risk of layer spalling due to excessive internal compressive stresses. The composition of such layers is defined in atomic percent by the following equation: $(Me_{1-a}X_a)_\alpha(N_{1-x-y}C_xO_y)$, where Me is one or more elements selected from among the groups 4a, 5a, and 6a of elements in the periodic system, X is one or more elements selected from among the group Al, Si, B, and S, where $0.10 \leq a \leq 0.65$, $0 \leq x \leq 10$, $0 \leq y \leq 10$, and $0.85 \leq \alpha \leq 1.25$. In addition, edge layers of this kind should have a face-centered cubic structure.

The prior art does not, however, disclose methods as to how PVD oxynitride hard material layers with a predetermined thermal conductivity can be manufactured.

The object of the present invention is to provide a method for manufacturing oxynitride hard material layers that have a predetermined thermal conductivity. Another object of the present invention is to provide a hard material layer system that includes such oxynitride hard material layers. Preferably, these oxynitride hard material layers should in particular have a higher wear resistance at high temperatures so that these hard material layers can be well suited particularly for the chip-removing machining of hard-to-machine materials.

In particular, the aim is to provide a method that makes it possible to produce a coating with a high thermal stability, reduced thermal conductivity, increased anisotropy of the thermal conductivity, and consequently an extended service life, thus making it possible to increase productivity in the chip-removing machining of hard-to-machine materials.

SUMMARY OF THE INVENTION

The object of the present invention is attained in that a method for manufacturing oxynitride hard material layers with a predetermined thermal conductivity is provided. The present invention also relates to the manufacture of hard material layer systems, the provision of a coated tool, and its use.

According to the present invention, hard oxynitride layers with a predetermined thermal conductivity can in particular be manufactured using PVD technology. The term PVD technology includes surface finishing methods in which the coating material is transported via the gas phase to the substrate surface to be coated. In most cases, the individual methods are divided—depending on the kind of energy introduced—into vaporizing, sputtering, and ion plating. These methods can in turn be broken down into certain sub-methods and variants. PVD methods such as magnetron sputtering and/or arc evaporation have become well established for coating component- and tool surfaces that are subject to powerful tribological stresses in use.

According to the present invention, the thermal conductivity in the hard material layer is influenced and thus adjusted as desired through the addition of oxygen during the layer deposition process.

The basic relationships will be described below by way of example in conjunction with two layer systems, titanium oxynitride $(Ti_aO_cN_{b-c})$ and chromium oxynitride $(Cr_dO_fN_{e-f})$, which will be studied in detail:

Starting from a pure titanium nitride $(Ti_aN_b)$ or pure or chromium nitride $(Cr_dN_e)$, through the controlled addition of oxygen, it is possible to retain both the cubic phase and the percentage of metallic elements relative to the percentage of non-metallic elements (metallic/nonmetallic) in atomic percent in the layer. This is possible because the oxygen is exchanged for the nitrogen in the lattice at a 1:1 ratio. It was possible to prove this relationship through the use of EDX and XRD measurements.

The addition of oxygen was controlled by means of conventional flow controllers so that the percentage of oxygen in the oxynitride layer was continuously increased until the desired thermal conductivity could be achieved.

According to the present invention, the oxygen percentage in an oxynitride layer preferably should not exceed a value of 30 at. %.

By means of Rockwell indentation, micro-indentation, raster electron microscopy (REM), and X-ray diffractometry (XRD; tests performed at both room temperature and elevated temperatures), it was possible to demonstrate that the layer properties did not significantly change with regard to layer adhesion, layer hardness, modulus of elasticity, layer morphology, grain size, phase distribution, and structural stability, i.e. the "set" positive (performance-relevant) layer properties are not significantly altered by the addition of $O_2$ in the layer composition range from 0 to 30 at. %. The thermal conductivity of the tested layers was determined using the Cahill method.

The addition of $O_2$ in the layer composition range from 0 to 30 at. % $O_2$ has a significant influence on the thermal conductivity of the layer.

DETAILED DESCRIPTION OF THE PREFERRED EMBODIMENTS

For these experiments, the layers were deposited using arc evaporation PVD techniques. The substrate temperature and the total pressure in the coating chamber during the coating processes were correspondingly kept constant at approximately 450° C. and 2 Pa. Nitrogen and oxygen were correspondingly used as reactive gases for the deposition of the nitride and oxynitride layers.

Figure 1:
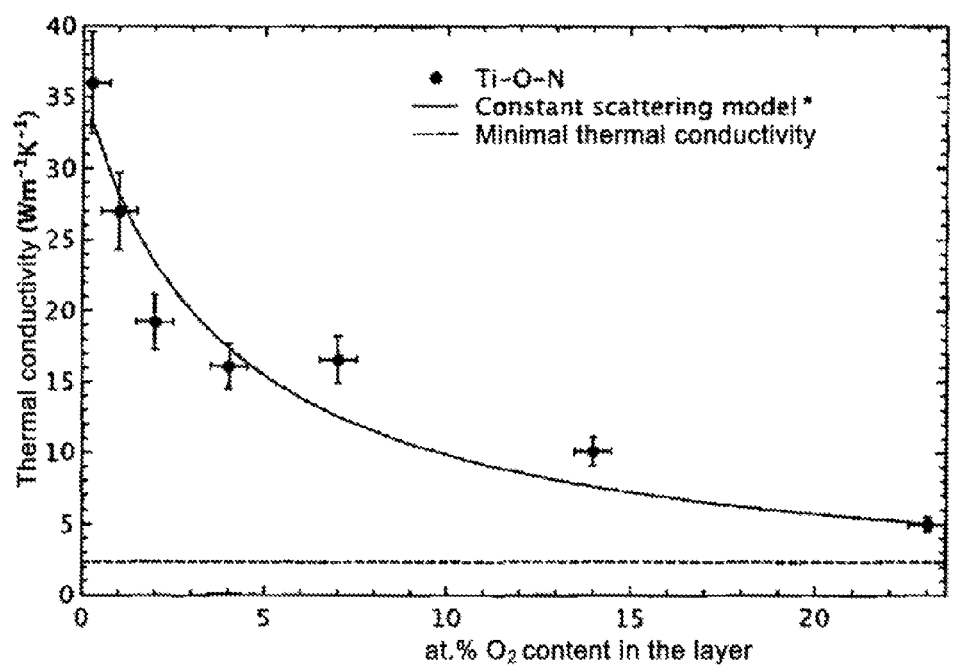
FIGS. 1 and 2 illustrate the relationship between the oxygen content in the layer and the thermal conductivity of the layer (measured from the layer surface) for the layer systems Ti—O—N and Cr—O—N.
Figure 2:
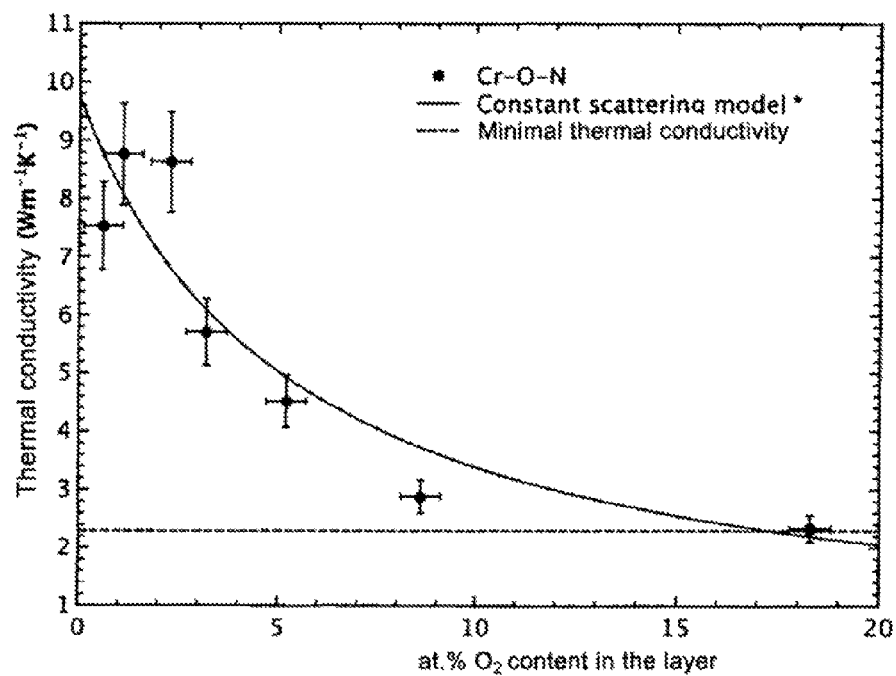

For both systems, this relationship can be mathematically described by means of the "constant scattering model" as demonstrated in FIGS. 1 and 2. This is an indication of the general applicability of this relationship. The addition of $O_2$ in this case changes the scattering cross-section, i.e. with the addition of $O_2$, increasing lattice defects are produced, which interfere with the propagation of lattice vibrations (phonons).

The replacement of nitrogen with oxygen in nitrides produces significant disorder in the material structure due to the different radius, different number of valence electrons, and higher electron negativity. Possible defects include empty lattice positions, occupied interstitial positions, lattice dislocations, and lattice distortions. All of these detects have a negative impact on the propagation of phonons in the crystal structure and thus potentially reduce the thermal conductivity of the material. In total, the influence of all defects on the thermal conductivity that an oxygen atom produces on average is referred to as the phonon scattering cross-section of oxygen. As long as the crystal structure of the material does not fundamentally change and no additional oxide phases are produced in addition to the nitride, it is possible to assume the existence of a scattering cross-section that is constant (independent of the oxygen content). This makes it possible to adjust the thermal conductivity by means of the oxygen content. The functional relationship is described by the following equation:

$$\kappa(\chi)=\kappa_0/(1+\alpha\cdot\chi)$$

where $\kappa(\chi)$ is the oxygen-dependent thermal conductivity of the material, $\kappa_0$ is the thermal conductivity in the oxygen-free material, $\chi$ indicates the oxygen concentration, and $\alpha$ is a parameter that includes the scattering cross-section. In order to find the parameter $\alpha$, a series of samples with different oxygen contents must be produced and the thermal conductivity measured. The adaptation of the function $\kappa(\chi)$ to the data yields $\alpha$.

Specifically, the present invention proposes using Al-rich AlTiN- and AlCrN-based coatings with controlled contents, preferably in the range from 0-30 at. % $O_2$, particularly preferably in the range from 3 to 25 at. % $O_2$, for the chip-removing machining of Ti- and Ni-based alloys, taking into account a combination with other alloy elements such as Si, B, W, Nb, Y, Mo, Ni.

The controlled addition of $O_2$ is used to optimize these layer systems for specific applications by producing a selected thermal conductivity behavior within the layer. Preferably, the thermal conductivity perpendicular to the layer is minimized (made as low as possible) and the thermal conductivity parallel to the layer is maximized (made as high as possible), i.e. the anisotropy of the thermal conductivity is maximized.

The $O_2$ concentration should not be so high that the mechanical, chemical, and structural properties of the layer system are significantly changed or negatively influenced.

Preferably, a hardness of the layer system of greater than 20 GPa or even more preferably greater than 30 GPa is achieved.

One embodiment of the present invention is a layer system composed of Ti—Al—N—O or Cr—Al—N—O, with the oxygen concentration within the layer being graduated in the direction of the layer thickness.

Another embodiment of the present invention is a layer system in which several layers with elevated and reduced oxygen concentrations are deposited in alternating fashion as a multilayer structure.

The use of graduations can be understood as follows: $O_2$ content is varied perpendicular to the substrate surface in accordance with the requirements.

The use of multilayer systems can be understood as follows: an $O_2$-rich AlTiN layer follows an $O_2$-free AlTiN layer in order to thus selectively increase the thermal conductivity parallel to the substrate and decrease it perpendicular to the substrate. The result is an optimized heat dissipation into the chip, i.e. out of the layer/substrate system.

The use of multilayer systems can also be understood as follows: an alternating sequence of AlCrN and AlTiN, respectively with or without $O_2$, in order to optimize anisotropy in the thermal conductivity in accordance with the above explanations while taking into account a combination with other alloy elements such as Si, B, W, Nb, Y, Mo, and Ni.

In particular, the present invention relates to a method for manufacturing metal oxynitride hard material layers by means of PVD techniques in a vacuum chamber; the hard material layer has a composition of $Me_pO_nN_m$ in atomic percent, where p+n+m=100%, and has a predetermined thermal conductivity: One method according to the present invention can be carried out as follows:

a. The metallic elements of the metal oxynitride hard material layer are deposited by means of physical gas phase deposition from at least one target; the target contains Me and Me is at least one metal from the group Ti, Zr, Hf, V, Nb, Ta, Cr, Mo, W, and Al and preferably, Me also includes at least one element from the group Y, Ni, B, and Si; and the target is used for the deposition of at least three layers using various processes, but using the same process parameters with the exception of the composition of the reactive gas.

b. Nitrogen is used as the reactive gas for the deposition of a first reference layer, which is a metal nitride layer $Me_{p1}O_{n1}N_{m1}$ with an oxygen concentration in atomic percent of $O_2$-conc1=n1=0, where the first reference layer is deposited with a constant substrate temperature Ts and a constant overall coating pressure P.

c. Nitrogen and oxygen are used as reactive gases for the deposition of a third reference layer, which is a metal oxynitride layer $Me_{p3}O_{n3}N_{m3}$ with an oxygen concentration in atomic percent of $O_2$-conc3=n3 of at most 30%, preferably $O_2$-conc3=is between 20 and 30%, where the third reference layer is deposited with the same constant substrate temperature Ts and the same constant overall coating pressure P as the deposition of the first reference layer and p1=p3 and p1/(m1+n1)=p3/(m3+n3).

d. Nitrogen and oxygen are used as reactive gases for the deposition of a second reference layer, which is a metal oxynitride layer $Me_{p2}O_{n2}N_{m2}$ with an oxygen concentration in atomic percent of $O_2$-conc2=n2 which is greater than $O_2$-conc1 and less than $O_2$-conc3, $O_2$-conc1 is between 5 and 20%, where the second reference layer is deposited with the same constant substrate temperature Ts and the same constant overall coating pressure P as the deposition of the first and third reference layers and p1=p3=p2 and p1/(m1+n1)=p3/(m3+n3)=p2/(m2+n2).

e. The thermal conductivity of the first, second, and third reference layers is measured starting from the layer surface of each layer.

f. The measured values of thermal conductivity and oxygen concentration of the first, second, and third reference layers are used to establish a correlation in the following, form:

$\kappa(\chi)=\kappa_0/(1+\alpha\cdot\chi)$ where $\kappa(\chi)$ is the oxygen-dependent thermal conductivity of the hard material layer system Me-O—N.

$\kappa_0$ is the thermal conductivity in the first reference layer, $\chi$ indicates the oxygen concentration, and $\alpha$ is a parameter that includes the scattering cross-section and that is obtained by adapting the function $\kappa(\chi)$ to the data.

g. The correlation is used to calculate the oxygen concentration in the $Me_pO_nN_m$ hard material layer at which a predetermined thermal conductivity is achieved and a calculation is performed as to the oxygen concentration of the reactive gas at which the coating process must be carried out in step h.

h. The $Me_pO_nN_m$ hard material layer with the predetermined thermal conductivity is deposited with the same process parameter as the reference layers with the exception of the oxygen concentration of the reactive gas, which must first be adapted in accordance with the value determined in step g.

The present invention also relates to hard material layer systems that are deposited on substrate surfaces and contain at least one $Me_pO_nN_m$ hard material layer produced according to the method described above.

Preferably, the $Me_pO_nN_m$ hard material layer of a hard material layer system according to the present invention includes a cubic structure and preferably, Me includes at least mostly titanium and aluminum or chromium and aluminum.

Preferably, the concentration ratio in atomic percent of Ti relative to Al, i.e. Ti/Al, or of Cr relative to Al, i.e. Cr/Al, is less than 1.

A particular embodiment of a hard material layer system according to the present invention has a graduated oxygen concentration across at least part of the layer thickness.

A particularly preferred embodiment of a hard material layer system according to the present invention has at least one part of the layer thickness across a multilayer structure, having, alternating layers A with the composition $Me_{ApA}O_{nA}N_{mA}$ and B layers with the composition $Me_{BpB}O_{nB}N_{mB}$, where $Me_A=Me_B$, $p_A=p_B$, $n_A<n_B$, and $p_A/(n_A+m_A)=p_B/(n_B+m_B)$.

A preferred variant of the above-described embodiment of as hard material layer system is characterized by A layers, where na=0.

Preferably, a hard material layer system according to the present invention is produced so that the thermal conductivity parallel to the substrate surface is greater than the thermal conductivity perpendicular to the substrate surface.

For particular applications, for example for the forming and chip-removing machining of certain materials, the use of a hard material layer system according to the present invention is particularly advantageous if it has a hardness of at least greater than 20 GPa and preferably greater than 30 GPa. Any components and tools can also be provided with a hard material layer system according to the present invention. In particular, coated chip-removing machining tools with a coating according, to the present invention are very promising for chip-removing machining of hard-to-machine materials such as Ni- and Ti-based alloys.

In particular, the present invention relates to:

A hard material layer system that is deposited onto a substrate surface and has a multilayered layer structure comprising alternating layers A and B, where the A layers have a composition of $Me_{ApA}O_{nA}N_{mA}$ in atomic percent and the B layers have a composition of $Me_{BpB}O_{nB}N_{mB}$ in atomic percent, where a. the thermal conductivity of the A layers is greater than the thermal conductivity of the B layers.

b. $Me_A$ and $Me_B$ each comprise at least one metal from the group Ti, Zr, Hf, V, Nb, Ta, Cr, Mo, W, and Al, c. $p_A$ indicates the atomic percentage of $Me_A$ and $p_B$ indicates the atomic percentage of $Me_B$ and the following is true: $p_A=p_B$, d. $n_A$ indicates the oxygen concentration in the A layers in atomic percent and $n_B$ indicates the oxygen concentration in the B layers in atomic percent and the following is true: $n_A<n_B$, and e. $m_A$ indicates the nitrogen concentration in the A layers in atomic percent and $m_B$ indicates the nitrogen concentration in the B layers in atomic percent and the following is true: $p_A/(n_A+m_A)=p_B/(n_B+m_B)$.

A hard material layer system according to the above-described embodiment, where Me$_A$ and/or Me$_B$ include(s) at least one other element from the group Si, B, W, Nb, Y, Mo, and Ni.

A hard material layer system according to one of the above-described embodiments, where Me$_A$=Me$_B$.

A hard material layer system according to one of the above-described embodiments, where 5%≤n$_B$≤30%, taking into account the fact that p$_A$+n$_A$+m$_A$=p$_B$+n$_B$+m$_B$=100%.

A hard material layer system according to one of the above-described embodiments, where n$_A$=0%.

A hard material layer system according to one of the above-described embodiments, where n$_A$ and n$_B$ are selected so that the A layers do not differ significantly from the B layers with regard to the layer hardness and modulus of elasticity and preferably also with regard to layer morphology and/or grain size and/or phase distribution and/or structural stability.

A hard material layer system according to one of the above-described embodiments, where the thermal conductivity of the hard material layer system is greater parallel to the substrate surface than the thermal conductivity of the hard material layer system perpendicular to the substrate surface. Preferably, the hardness of the hard material layer system is greater than 20 GPa, and more preferably greater than 30 GPa.

A hard material layer system according to one of the above-described embodiments, where at least the multilayered layer structure has a cubic structure.

A hard material layer system according to one of the above-described embodiments, where Me$_A$ and/or Me$_B$ at least mostly include(s) the metals aluminum and/or titanium or the metals aluminum and/or chromium.

A hard material layer system according to one of the above-described embodiments, where the concentration ratio in atomic percent of titanium relative to aluminum, i.e. Ti/l, or of chromium relative to aluminum, i.e. Cr/Al, is less than 1.

A hard material layer system according to one of the above-described embodiments, where at least one A layer or one B layer comprises at least a part of the layer thickness across a graduated oxygen concentration or the hard material layer system has at least one additional hard material layer of the type Me$_p$O$_n$N$_m$ where n≥0, Me=Me$_A$, and p=p$_A$ or Me=Me$_B$, and p=p$_B$, preferably as a top layer, which comprises at least a part of the layer thickness across a graduated oxygen concentration.

A component or tool, preferably a chip-removing machining tool, that is coated with hard material layer system according to one of the above-described embodiments.

The use of a cutting tool for coated chip-removing machining having a hard material layer system according to one of the above-described embodiments for the chip-removing machining of hard-to-machine materials such as Ni- and/or Ti-based alloys.

A method for manufacturing a metal oxynitride hard material layer of the type Me$_p$O$_n$N$_m$ with a predetermined oxygen-dependent thermal conductivity, i.e. a predetermined oxygen-dependent thermal conductance, where a. the Me$_p$O$_n$N$_m$ layer is deposited in a vacuum coating chamber by means of physical gas phase deposition from at least one target in a reactive gas-containing atmosphere with a substrate temperature Ts and a coating pressure P onto a substrate surface, b. nitrogen and oxygen are used as reactive gases, c. the target contains Me, and d. Me is at least one metal from the group Ti, Zr, Hf, V, Nb, Ta, Cr, Mo, W, and Al and Me preferably includes at least one element from the group Y, Ni, B, and Si, wherein e. the oxygen concentration in the vacuum coating chamber is controlled during the deposition of the Me$_p$O$_n$N$_m$ layer so that an oxygen concentration value, which has been previously calculated by means of the correlation κ(χ)=κ$_0$/(1+α·χ), is maintained so that the predetermined oxygen-dependent thermal conductivity in the Me$_p$O$_n$N$_m$ layer is set during the layer deposition, where:

i. κ(χ) is the oxygen-dependent thermal conductivity of a Me$_p$O$_n$N$_m$ layer, which is produced while maintaining an oxygen concentration in the vacuum coating chamber during the layer deposition, ii. χ indicates the oxygen concentration in the vacuum coating chamber during the layer deposition, iii. κ$_0$ is the thermal conductivity of a first reference layer Me$_{p0}$O$_{n0}$N$_{m0}$, where n$_0$=0% and Me$_{p0}$O$_{n0}$N$_{m0}$ is deposited with the same process parameters described above with regard to the deposition of Me$_p$O$_n$N$_m$, but without the use of oxygen as a reactive gas and using only nitrogen instead.

iv. α is a parameter that includes the scattering cross-section and that is obtained by adapting the above-indicated correlation to experimental data of at least one additional second reference layer Me$_{p1}$O$_{n1}$N$_{m1}$ and one additional third reference layer Me$_{p2}$O$_{n2}$N$_{m2}$, where Me$_{p1}$O$_{n1}$N$_{m1}$ and Me$_{p2}$O$_{n2}$N$_{m2}$ are deposited with the same process parameters described above with regard to the deposition of Me$_p$O$_n$N$_m$, but using different oxygen concentrations in the vacuum coating chamber and preferably Me$_{p1}$O$_{n1}$N$_{m1}$ is deposited using an oxygen concentration in the vacuum coating chamber that results in an oxygen concentration in atomic percent of between 5 and 20% in the layer n$_1$ while Me$_{p2}$O$_{n2}$N$_{m2}$ is deposited using an oxygen concentration that results in an oxygen concentration in atomic percent of between 20 and 30% in the layer n$_2$, taking into account the fact that p$_0$+n$_0$+m$_0$=p$_1$+n$_1$+m$_1$=p$_2$+n$_2$+m$_2$=100%, m$_1$ and m$_2$ are greater than zero, p$_0$=p$_1$=p$_2$, and p$_0$/(n$_0$+m$_0$)=p$_1$/(n$_1$+m$_1$)=p$_2$/(n$_2$+m$_2$))

Preferably, the oxygen concentration in the vacuum coating chamber is controlled by adjusting the oxygen flow, particularly during the deposition of the Me$_p$O$_n$M$_m$ layer.

The invention claimed is:

1. A hard material layer system that is deposited onto a substrate surface and has a multilayered layer structure comprising:

alternating layers A and B, where the A layers have a composition of Me$_{ApA}$O$_{nA}$N$_{mA}$ atomic percent and the B layers have a composition of Me$_{BpB}$O$_{nB}$N$_{mB}$ in atomic percent, wherein:

a. a thermal conductivity of the A layers is greater than a thermal conductivity of the B layers, b. Me$_A$ and Me$_B$ each comprise at least one metal selected from the group consisting of Ti, Zr, Hf, V, Nb, Ta, Cr, Mo, W, and Al, c. p$_A$ indicates an atomic percentage of Me$_A$ and p$_B$ indicates an atomic percentage of Me$_B$ and P$_A$=P$_B$, d. n$_A$ indicates an oxygen concentration in the A layers in atomic percent and n$_B$ indicates an oxygen concentration in the B layers in atomic percent and n$_A$<n$_B$, e. $m_A$ indicates a nitrogen concentration in the A layers in atomic percent and $m_B$ indicates a nitrogen concentration in the B layers in atomic percent and $p_A/(n_A+m_A)=p_B/(n_B+m_B)$;

f. MeA=MeB; and g. $5\% \leq n_B \leq 30\%$, and $p_A+n_A+m_A=p_B+n_B+m_B=100\%$.

2. The hard material layer system according to claim 1, wherein $Me_A$ and $Me_B$ each further comprise at least one element selected from the group consisting of Si, B, W, Nb, Y, Mo, and Ni.

3. The hard material layer system according to claim 1, wherein $n_A=0\%$.

4. The hard material layer system according to claim 1, wherein $n_A$ and $n_B$ are selected so that the A layers do not differ significantly from the B layers with regard to the layer hardness and modulus of elasticity.

5. The hard material layer system according to claim 1, wherein a thermal conductivity of the hard material layer system is greater parallel to a substrate surface than the thermal conductivity of the hard material layer system perpendicular to the substrate surface.

6. The hard material layer system according to claim 1, wherein a hardness of the hard material layer system is greater than 20 GPa.

7. The hard material layer system according to claim 1, wherein at least the multilayered layer structure has a cubic structure.

8. The hard material layer system according to claim 1, wherein $Me_A$ and $Me_B$ at least mostly include the metals aluminum and/or titanium or the metals aluminum and/or chromium.

9. The hard material layer system according to claim 1, wherein a concentration ratio in atomic percent of titanium relative to aluminum, i.e. Ti/Al, or of chromium relative to aluminum, i.e. Cr/Al, is less than 1.

10. The hard material layer system according to claim 1, wherein at least one A layer or at least one B layer comprises at least a part of a layer thickness across a graduated oxygen concentration or the hard material layer system has at least one additional hard material layer of the type $Me_pO_nN_m$ where $n \geq 0$, $Me=Me_A$, and $p=P_A$ or $Me=Me_B$, and $p=p_B$, as a top layer, which comprises at least a part of the layer thickness across a graduated oxygen concentration.

11. A component or a cutting tool for chip-removing machining, that is coated with the hard material layer system according to claim 1.

12. A method of using a cutting tool for chip-removing machining comprising using the cutting tool according to claim 11 for the chip-removing machining of hard-to-machine materials comprising Ni- and/or Ti-based alloys.

13. The hard material layer system according to claim 1, wherein $n_A$ and $n_B$ are selected so that the A layers do not differ significantly from the B layers with regard to layer morphology and/or grain size.

14. The hard material layer system according to claim 1, wherein $n_A$ and $n_B$ are selected so that the A layers do not differ significantly from the B layers with regard to phase inventory and/or structural stability.

15. A method for manufacturing a metal oxynitride hard material layer of the type $Me_pO_nN_m$ with a predetermined oxygen-dependent thermal conductivity, i.e. a predetermined oxygen-dependent thermal conductance, the method comprising:

a. depositing the $Me_pO_nN_m$ layer in a vacuum coating chamber using physical gas phase deposition from at least one target in a reactive gas-containing atmosphere with a substrate temperature Ts and a coating pressure P onto a substrate surface, b. using nitrogen and oxygen as reactive gases, c. wherein the target contains Me, and d. wherein Me comprises at least one metal selected from the group consisting of Ti, Zr, Hf, V, Nb, Ta, Cr, Mo, W, and Al and Me further comprises at least one element selected from the group consisting of Y, Ni, B, and Si, e. controlling an oxygen concentration in the vacuum coating chamber during the deposition of the $Me_pO_nN_m$ layer so that an oxygen concentration value, which has been previously calculated by the correlation $\kappa(\chi)=\kappa_0/(1+\alpha \cdot \chi)$, is maintained so that the predetermined oxygen-dependent thermal conductivity in the $Me_pO_nN_m$ layer is set during the layer deposition, where:

i. $\kappa(\chi)$ is the oxygen-dependent thermal conductivity of a $Me_pO_nN_m$ layer, which is produced while maintaining an oxygen concentration in the vacuum coating chamber during the layer deposition, ii. $\chi$ indicates the oxygen concentration in the vacuum coating chamber during the layer deposition, iii. $\kappa_0$ is the thermal conductivity of a first reference layer $Me_{p0}O_{n0}N_{m0}$, where $n_0=0\%$ and $Me_{p0}O_{n0}N_{m0}$ is deposited with the same process parameters described above with regard to the deposition of $Me_pO_nN_m$, but without the use of oxygen as a reactive gas and using only nitrogen instead, iv. $\alpha$ is a parameter that includes a scattering cross-section and that is obtained by adapting the above-indicated correlation to experimental data of at least one additional second reference layer $Me_{p1}O_{n1}N_{m1}$ and one additional third reference layer $Me_{p2}O_{n2}N_{m2}$, where $Me_{p1}O_{n1}N_{m1}$ and $Me_{p2}O_{n2}N_{m2}$ are deposited with the same process parameters described above with regard to the deposition of $Me_pO_nN_m$, but using different oxygen concentrations in the vacuum coating chamber and $Me_{p1}O_{n1}N_{m1}$ is deposited using an oxygen concentration in the vacuum coating chamber that results in an oxygen concentration in atomic percent of between 5 and 20% in a layer $n_1$ while $Me_{p2}O_{n2}N_{m2}$ is deposited using an oxygen concentration that results in an oxygen concentration in atomic percent of between 20 and 30% in a layer $n_2$, taking into account that $p_0+n_0+m_0=p_1+n_1+m_1=p_2+n_2+m_2=100\%$, $m_1$ and $m_2$ are greater than zero, $p_0=p_1=p_2$, and $p_0/(n_0+m_0)=p_1/(n_1+m_1)=p_2/(n_2+m_2)$.

* * * * *